United States Patent
Huang et al.

(10) Patent No.: US 10,498,353 B2
(45) Date of Patent: Dec. 3, 2019

(54) SUCCESSIVE APPROXIMATION REGISTER QUANTIZER AND CONTINUOUS-TIME SIGMA-DELTA MODULATOR

(71) Applicant: REALTEK SEMICONDUCTOR CORPORATION, Hsinchu (TW)

(72) Inventors: Bi-Ching Huang, Hsinchu (TW); Yu-Chang Chen, New Taipei (TW); Chih-Lung Chen, Hsinchu County (TW); Jie-Fan Lai, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/170,765

(22) Filed: Oct. 25, 2018

(65) Prior Publication Data

US 2019/0181880 A1  Jun. 13, 2019

(30) Foreign Application Priority Data

Dec. 12, 2017 (TW) ............................. 106143612 A

(51) Int. Cl.
*H03M 3/00* (2006.01)
*H03M 1/68* (2006.01)

(52) U.S. Cl.
CPC ............ *H03M 3/426* (2013.01); *H03M 1/68* (2013.01); *H03M 3/428* (2013.01); *H03M 3/464* (2013.01)

(58) Field of Classification Search
CPC .............................. H03M 3/426; H03M 3/464
USPC ........ 341/161, 163, 143, 155, 144, 118, 120
See application file for complete search history.

(56) References Cited

U.S. PATENT DOCUMENTS

| | | | |
|---|---|---|---|
| 8,610,611 B2 | 12/2013 | Venkatraman et al. | |
| 8,928,511 B2 | 1/2015 | Lin et al. | |
| 9,319,059 B1 | 4/2016 | Sharma et al. | |
| 10,008,338 B2* | 6/2018 | Stadermann et al. | H03M 1/667 |
| 2011/0084866 A1* | 4/2011 | Hsu | H03M 1/16 341/156 |
| 2013/0015996 A1* | 1/2013 | Furuta | H03M 1/06 341/172 |
| 2016/0126967 A1* | 5/2016 | Oh | H03M 1/06 341/118 |
| 2017/0250702 A1* | 8/2017 | Venca et al. | G01D 5/56 |
| 2017/0353192 A1* | 12/2017 | Tsai | H03M 1/1245 |

OTHER PUBLICATIONS

Chi-Yun Wang et al., "A Mode-Configurable Analog Baseband for Wi-Fi 11 ac Direct-Conversion Receiver Utilizing a Single Filtering ADC", 2016 IEEE Radio Frequency Integrated Circuits Symposium.

(Continued)

*Primary Examiner* — Peguy Jean Pierre
(74) *Attorney, Agent, or Firm* — WPAT, PC

(57) ABSTRACT

Disclosed is a successive approximation register (SAR) quantizer and a continuous-time sigma-delta modulator (CTSDM) using the SAR quantizer. The SAR quantizer is capable of generating M highly-significant bits as a digital output signal, and generating L lowly-significant bit(s) for the execution of noise shaping operation. Therefore, the SAR quantizer and the CTSDM can reduce the demand for the circuit area of a digital-to-analog converter and lower the delay of a critical path, so as to improve the performance and cut the cost.

10 Claims, 7 Drawing Sheets

(56) References Cited

OTHER PUBLICATIONS

Yonghua Cong et al., "A 1.5-V 14-Bit 100-MSs Self-Calibrated DAC", IEEE Journal of Solid-State Circuits, vol. 38, No. 12, Dec. 2003.
John G. Kauffman et al., "An 85 mW Continuous-Time Modulator With 25 MHz Bandwidth Using Digital Background DAC Linearization to Achieve 63.5 dB SNDR and 81 dB SFDR", John G. Kauffman, Student Member, IEEE, Pascal Witte, Member, IEEE, Joachim Becker, Member, IEEE, and Maurits Ortmanns, Senior Member, IEEE.
Hung-Chieh Tsai et al., "A 64-fJ_Conv.-Step Continuous-Time Sigma Delta Modulator in 40-nm CMOS Using Asynchronous SAR Quantizer and Digital Delta Sigma Truncator", IEEE Journal of Solid-State Circuits, vol. 48, No. 11, Nov. 2013.
Taiwan Intellectual Property Office, Office Action of counterpart TW application( appl. No. 106143612) dated Jun. 29, 2018. Summary in English on page 1.

* cited by examiner

SUCCESSIVE APPROXIMATION REGISTER QUANTIZER AND CONTINUOUS-TIME SIGMA-DELTA MODULATOR

BACKGROUND OF THE INVENTION

1. Field of the Invention

The present invention relates to a quantizer and a sigma-delta modulator, especially to a quantizer having a noise-shaping function and to a sigma-delta modulator using the quantizer or the equivalent thereof.

2. Description of Related Art

In recent years, the requirement of continuous-time sigma-delta modulator (CTSDM) gets more and more strict to achieve better performance; in this circumstance, some CTSDM adopts a multi-bit quantizer of higher resolution (e.g., a four-bit quantizer or the better) to satisfy the requirement. However, as the number of bits of a multi-bit quantizer in a CTSDM increases, the design of a digital-to-analog converter (DAC) in the CTSDM gets harder and harder to fulfill the demand for high performance, low cost, etc. Some instances of the above-mentioned design are as follows:
1. The DAC in the CTSDM uses a calibration technique. However, for DACs using different chips respectively, the effects of this manner may vary, and the effects may be good at certain frequencies or temperatures but poor at the other frequencies or temperatures (e.g., a high frequency or a high temperature).
2. The DAC in the CTSDM is designed to fulfill the dynamic range (DR) of an analog-to-digital converter (ADC). However, this manner leads to a large circuit size of the DAC which is not cost-effective.
3. The DAC in the CTSDM uses a dynamic element matching (DEM) technique (e.g., a data weighted averaging (DWA) technique). However, this manner may have the problem of a long critical path delay which affects the excess loop delay of the CTSDM.
4. The DAC in the CTSDM uses a digital delta-sigma truncator technique and optionally uses the DEM technique. This manner may have the problem of the whole delay being too long and affect the excess loop delay of the CTSDM.

Some related arts are found in the literatures listed below:
1. Chi-Yun Wang, Shu-Wei Chu, Tzu-Hsuin Peng, Jen-Che Tsai, and Chih-Hong Lou, "A Mode-Configurable Analog Baseband for Wi-Fi 11ac Direct-Conversion Receiver Utilizing a Single Filtering ADC", 2016 IEEE Radio Frequency Integrated Circuits Symposium.
2. Yonghua Cong, Student Member, IEEE, and Randall L. Geiger, Fellow, IEEE, "A 1.5-V 14-Bit 100-MSs Self-Calibrated DAC", IEEE JOURNAL OF SOLID-STATE CIRCUITS, VOL. 38, NO. 12, December 2003.
3. John G. Kauffman, Student Member, IEEE, Pascal Witte, Member, IEEE, Joachim Becker, Member, IEEE, and Maurits Ortmanns, Senior Member, IEEE, "An 8.5 mW Continuous-Time Modulator With 25 MHz Bandwidth Using Digital Background DAC Linearization to Achieve 63.5 dB SNDR and 81 dB SFDR", John G. Kauffman, Student Member, IEEE, Pascal Witte, Member, IEEE, Joachim Becker, Member, IEEE, and Maurits Ortmanns, Senior Member, IEEE.
4. Hung-Chieh Tsai, Chi-Lun Lo, Chen-Yen Ho, Member, IEEE, and Yu-Hsin Lin, "A 64-fJ_Conv.-Step Continuous-Time Sigma Delta Modulator in 40-nm CMOS Using Asynchronous SAR Quantizer and Digital Delta Sigma Truncator", IEEE JOURNAL OF SOLID-STATE CIRCUITS, VOL. 48, NO. 11, November 2013.
5. US patent of U.S. Pat. No. 8,928,511.

SUMMARY OF THE INVENTION

An object of the present invention is to provide a bit-reducing noise-shaping successive approximation register (SAR) quantizer and a continuous-time sigma-delta modulator (CTSDM) that are capable of achieving high performance in a reasonable cost.

An embodiment of the bit-reducing noise-shaping SAR quantizer of the present invention includes an SAR highly-significant-bit switch circuit, a lowly-significant-bit switch circuit, a comparing circuit, a highly-significant-bit control circuit and a lowly-significantly-bit control circuit. The SAR highly-significant-bit switch circuit is configured to successively generate M highly-significant-bit sampling result(s) according to an analog input signal and a first switch control signal, in which the M is a positive integer. The lowly-significant-bit switch circuit is configured to successively generate L lowly-significant-bit sampling result(s) according to the analog input signal and a second control signal, in which the L is a positive integer. The comparing circuit is configured to generate M highly-significant-bit comparison result(s) according to the M highly-significant-bit sampling result(s) and generate L lowly-significant-bit comparison result(s) according to the L lowly-significant-bit sampling result(s). The highly-significant-bit control circuit is configured to generate the first switch control signal according to the M highly-significant-bit comparison result(s) and output a digital output signal according to the M highly-significant-bit comparison result(s). The lowly-significant-bit control circuit is configured to generate the second control signal according to previously-generated L lowly-significant-bit comparison result(s) and the L lowly-significant-bit comparison result(s).

An embodiment of the CTSDM of the present invention includes a calculating circuit, a filtering circuit, a bit-reducing noise-shaping SAR quantizer and a digital-to-analog converter (DAC). The calculating circuit is configured to generate a to-be-filtered signal according to an input signal and a feedback signal. The filtering circuit is configured to generate a filtered signal according to the to-be-filtered signal. The bit-reducing noise-shaping SAR quantizer is the quantizer of the present invention or the equivalent thereof, and configured to generate a digital output signal according to the filtered signal; more specifically, the bit-reducing noise-shaping SAR quantizer is configured to generate M highly-significant bit(s) as the digital output signal and generate L lowly-significant bit(s) so that the bit-reducing noise-shaping SAR quantizer can carry out noise-shaping operation according to the L lowly-significant bit(s), in which both the M and the L are positive integers. The DAC is configured to generate the feedback signal according to the digital output signal.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms acknowledged in this industrial field. If any term is defined in this specification, such term should be explained accordingly.

The present disclosure includes a bit-reducing noise-shaping successive approximation register (SAR) quantizer and a continuous-time sigma-delta modulator (CTSDM) which can reduce the demand for the circuit area of a digital-to-analog converter and lower the delay of a critical path so as to improve the performance and cut the cost.

Figure 1:
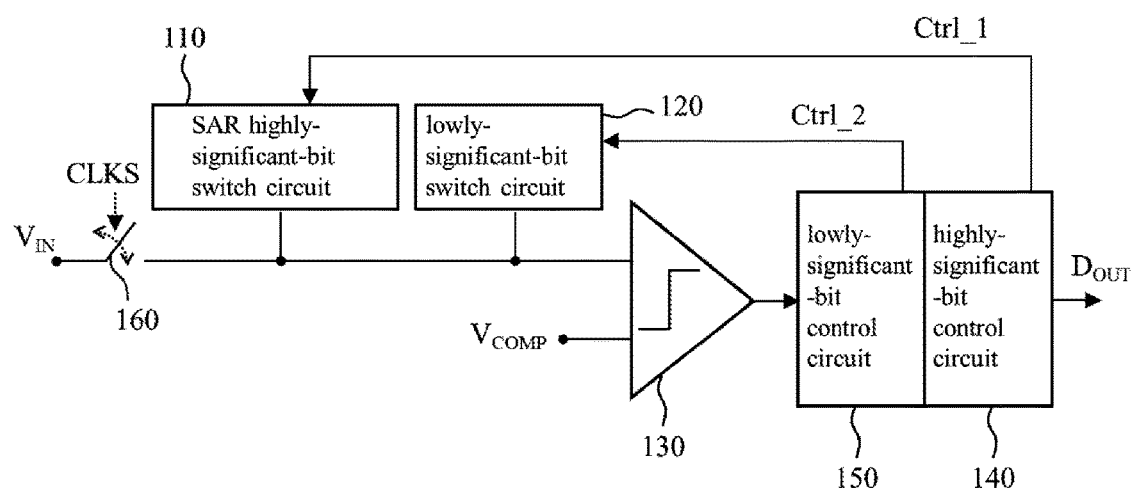
FIG. 1 shows an embodiment of the bit-reducing noise-shaping successive approximation register (SAR) quantizer of the present invention.

FIG. 1 shows an embodiment of the bit-reducing noise-shaping SAR quantizer of the present invention. This embodiment is suitable for an application with a single-ended input. The bit-reducing noise-shaping SAR quantizer 100 of FIG. 1 includes an SAR highly-significant-bit switch circuit 110, a lowly-significant-bit switch circuit 120, a comparing circuit 130, a highly-significant-bit control circuit 140, a lowly-significant-bit control circuit 150 and a sampling-control switch 160. In consideration of the reduction in circuit area and power consumption, the bit-reducing noise-shaping SAR quantizer 100 uses a circuit of SAR configuration; however, people of ordinary skill in the art can use circuits of other configurations to carry out the bit-reducing noise-shaping SAR quantizer 100. The sampling-control switch 160 is configured to control the time for the SAR quantizer 100 sampling an analog input signal $V_{IN}$ by a sampling-control signal CLKS (e.g., a clock signal); in other words, the sampling-control signal CLKS determines an operation cycle of the SAR quantizer 100 (i.e., a cycle to sample and quantize the analog input signal $V_{IN}$).

Figure 2:
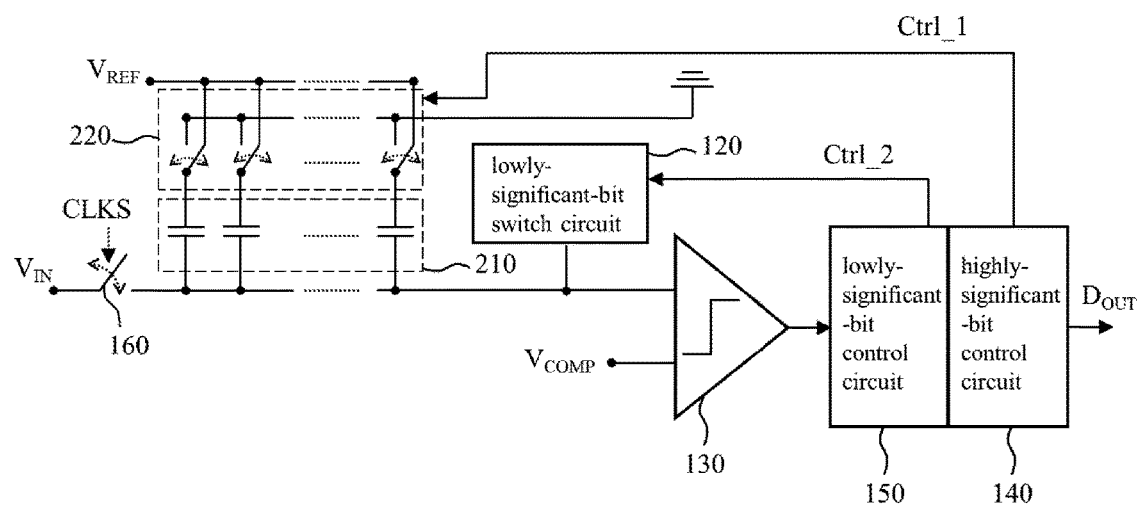
FIG. 2 shows an embodiment of the SAR highly-significant-bit switch circuit of FIG. 1.

Please refer to FIG. 1. The SAR highly-significant-bit switch circuit 110 is configured to generate M highly-significant-bit sampling result(s) according to the analog input signal $V_{IN}$ and a first switch control signal Ctrl_1 in a predetermined order. An exemplary implementation of the predetermined order is a part or all of a bit production order from a most significant bit (MSB) (e.g., the first bit in one operation cycle of the SAR quantizer 100) to a least significant bit (LSB) (e.g., the $(M+L)^{th}$ bit in one operation cycle of the SAR quantizer 100) and the M is a positive integer. FIG. 2 shows an embodiment of the SAR highly-significant-bit switch circuit 110 including a first capacitor circuit 210 and a first switch circuit 220. The first capacitor circuit 210 is configured to carry out sampling operation and charge-redistribution operation according to the analog input signal $V_{IN}$ and a plurality of first reference voltages (e.g., a positive reference voltage and a grounding voltage). The first switch circuit 220 is configured to control the connection between the first capacitor circuit 210 and a plurality of first reference voltage terminals (e.g., a positive reference voltage terminal $V_{REF}$ and a grounding voltage terminal), in which the first reference voltage terminals are configured to provide the first reference voltages respectively. Since the configuration and the operation of the first capacitor circuit 210 and the first switch circuit 220 in FIG. 2 are identical/similar to those of a capacitor and switch circuit of a general SAR analog-to-digital converter (ADC), their detail is omitted here.

Figure 3:
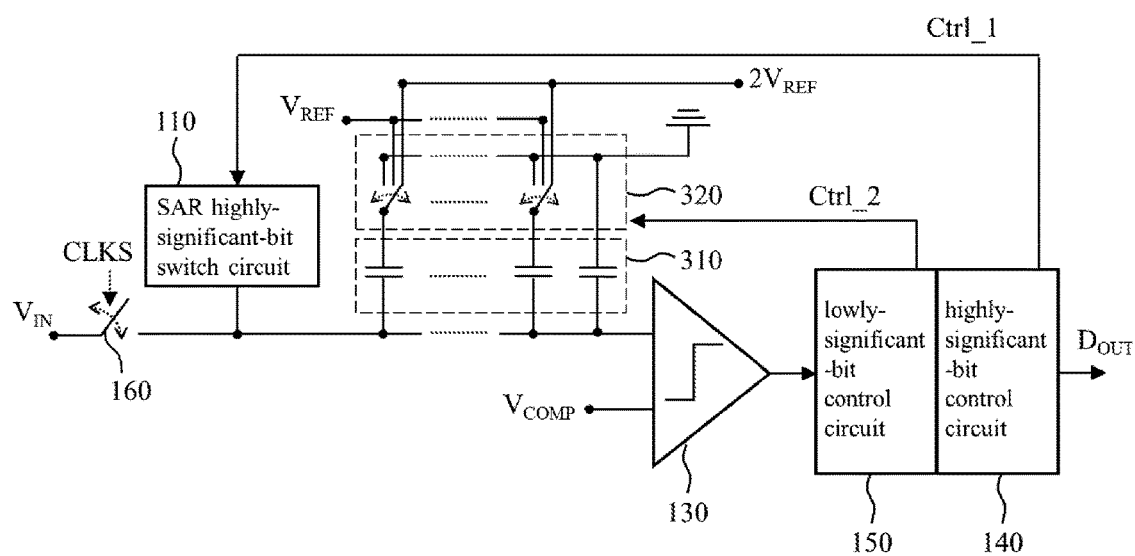
FIG. 3 shows an embodiment of the lowly-significant-bit switch circuit of FIG. 1.

Please refer to FIG. 1. The lowly-significant-bit switch circuit 120 is configured to generate L lowly-significant-bit sampling result(s) according to the analog input signal $V_{IN}$ and a second control signal Ctrl_2 in a predetermined order (e.g., a part or all of the aforementioned bit production order), in which the L is a positive integer. It should be noted that before L previously-generated lowly-significant-bit comparison result(s) (e.g., L lowly-significant-bit comparison result(s) generated by the SAR quantizer 100 in a previous operation cycle (e.g., the first operation cycle) of the SAR quantizer 100) are generated, the previously-generated lowly-significant-bit comparison result(s) is/are zero or value(s) which has/have no substantial effect on the sampling result(s) of the SAR quantizer 100. An embodiment of the lowly-significant-bit switch circuit 120 is an SAR lowly-significant-bit switch circuit as shown in FIG. 3, including a second capacitor circuit 310 and a second switch circuit 320. The second capacitor circuit 310 is configured to carry out sampling operation and charge-redistribution operation according to the analog input signal $V_{IN}$ and a plurality of second reference voltages (e.g., a positive reference voltage and a grounding voltage). The second switch circuit 320 is configured to control the connection between the second capacitor circuit 310 and a plurality of second reference voltage terminals (e.g., a positive reference voltage terminal $2V_{REF}$, a positive reference voltage terminal $V_{REF}$ and a grounding voltage terminal) according to the second control signal, in which the second reference voltage terminals are configured to provide to the second reference voltages. It should be noted that in one operation cycle of the SAR quantizer 100, the highly-significant-bit control circuit 140 in FIG. 2 connects every switch of the first switch circuit 220 to one of the first reference voltage terminals (e.g., the aforementioned positive reference voltage terminal $V_{REF}$ among the terminal $V_{REF}$ and the grounding voltage terminal) in the beginning by the control of the first switch control signal Ctrl_1, and then determines the connection between the first switch circuit 220 and the first reference voltage terminals according to the highly-significant-bit comparison result(s) described in the later paragraph; however, in the same operation cycle, the lowly-significant-bit control circuit 150 in FIG. 3 determines the connection between the second switch circuit 320 and the second reference voltage terminals according to previously-generated lowly significant-bit comparison result(s) in the beginning by the control of the second control signal Ctrl_2, and then determines the connection between the second switch circuit 320 and the second reference voltage terminals according to the lowly-significant-bit comparison result(s) described in the later paragraph. For instance, if the previously-generated lowly-significant-bit comparison results in the aforementioned predetermined order are 1, 1, . . . , and 0, the switches of the second switch circuit 320 are connected to the positive reference voltage terminal $2V_{REF}$, the positive reference voltage terminal $2V_{REF}$, . . . , and the grounding voltage terminal in the predetermined order respectively; if the previously-generated lowly-significant-bit comparison results in the predetermined order are 1, . . . , 0 and 1, the switches of the second switch circuit 320 are connected to the positive reference voltage terminal $2V_{REF}$, . . . , the grounding voltage terminal and the positive reference voltage terminal $2V_{REF}$ in the predetermined order respectively; and so on and so forth.

It should be noted that as long as the previously-generated lowly-significant-bit comparison result(s) can be taken into consideration, the design of the capacitor array and the reference voltages of the SAR lowly-significant-bit switch circuit 120 composed of the second capacitor circuit 310 and the second switch circuit 320 in FIG. 3 (e.g., the amount of capacitors and the values of these capacitors, and the amount of the reference voltages terminals and the voltages of these terminals) and the control logic of this design can be modified flexibly. For instance, the second reference voltage terminals of FIG. 3 can be implemented to be associated with the negative input end of a comparator; meanwhile, by a known or self-developed technique the lowly-significant-bit control circuit 150 converts the previously-generated comparison result(s) into a comparator input voltage (included in the second control signal Ctrl_2) as an input voltage $V_{COMP}$ received by the comparing circuit 130 in FIG. 3, in which the comparator input voltage is dependent upon the previously-generated lowly-significant-bit comparison result(s) and the operation of the SAR lowly-significant-bit switch circuit 120 is similar to the operation of a general SAR ADC. It should also be noted that the lowly-significant-bit switch circuit 120 can be a circuit of other types as long as the circuit is capable of taking the previously-generated lowly-significant-bit comparison result(s) into consideration and sampling the current analog input signal $V_{IN}$ to generate the current lowly-significant-bit sampling result(s).

Please refer to FIG. 1. The comparing circuit 130 is configured to successively generate M highly-significant comparison result(s) according to the input voltage $V_{COMP}$ (e.g., the grounding voltage or the aforementioned comparator input voltage) and the M highly-significant-bit sampling result(s), and configured to successively generate L lowly-significant-bit comparison result(s) according to the input voltage $V_{COMP}$ and the L lowly-significant-bit sampling result(s). The highly-significant-bit control circuit 140 is configured to generate the first switch control signal Ctrl_1 according to a first control algorithm (e.g., a general control algorithm for a switch circuit of a conventional SAR ADC) and the M highly-significant-bit comparison result(s), and configured to output a digital output signal $D_{OUT}$ according to the M highly-significant-bit comparison result(s). In an exemplary implementation, the number of bit(s) of the digital output signal $D_{OUT}$ is M; in another exemplary implementation, the number of bit(s) of the digital output signal $D_{OUT}$ is greater than or equal to one. The lowly-significant-bit control circuit 150 is configured to generate the second control signal Ctrl_2 according to a second control algorithm (e.g., the algorithm for controlling the second switch circuit 320 described in the preceding paragraph), the previously-generated L lowly-significant-bit comparison result(s) and the L lowly-significant-bit comparison result(s) (i.e., the current L lowly-significant-bit comparison result(s)). The second control signal Ctrl_2 optionally includes a switch control signal (e.g., the signal for controlling the second switch circuit 320 in FIG. 3), a voltage signal (e.g., the aforementioned comparator input voltage), etc. The configuration and the operation of the comparing circuit 130 is similar/equivalent to those of the comparing circuit of a general SAR ADC, and thus their detail is omitted here. The configuration and the operation of the highly-significant-bit control circuit 140 and the lowly-significant-bit control circuit 150 are similar/equivalent to those of the control circuit of a general SAR ADC, and thus their detail is omitted here.

Figure 4:
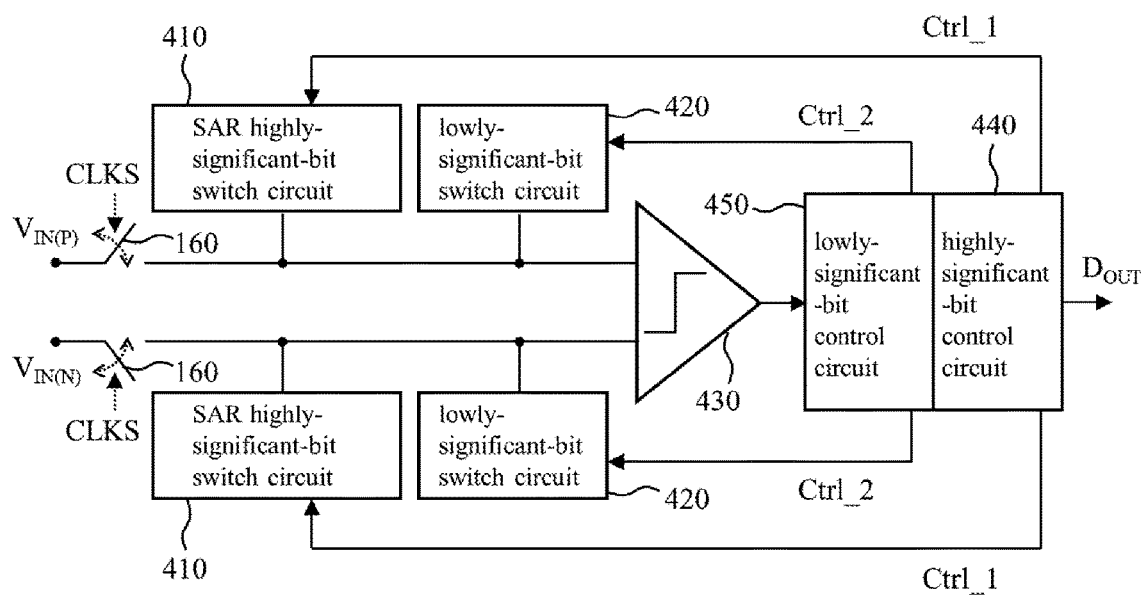
FIG. 4 shows another embodiment of the bit-reducing noise-shaping SAR quantizer of the present invention.

FIG. 4 shows another embodiment of the bit-reducing noise-shaping SAR quantizer of the present invention. This embodiment is suitable for an application with a differential input. The bit-reducing noise-shaping SAR quantizer 400 in FIG. 4 includes two SAR highly-significant-bit switch circuits 410 (which can be treated as two subordinate circuits of one SAR highly-significant-bit switch circuit), two lowly-significant-bit switch circuits 420 (which can be treated as two subordinate circuits of one lowly-significant-bit switch circuit), a comparing circuit 430, a highly-significant-bit control circuit 440 and a lowly-significant-bit control circuit 450. An embodiment of each highly-significant-bit switch circuit 410 is the aforementioned SAR highly-significant-bit switch circuit 110. An embodiment of each lowly-significant-bit switch circuit 420 is the aforementioned lowly-significant-bit switch circuit 120. The comparing circuit 430 is configured to receive the sampling result(s) of a positive input $V_{IN(P)}$ of a differential signal and receive the sampling result(s) of a negative input $V_{IN(N)}$ of the differential signal through two input terminals, the comparing circuit 430 optionally includes one or more additional input terminal(s) for receiving a comparator input signal that is derived from previously-generated lowly-significant-bit comparison result(s), and the comparing circuit 430 processes the received signals. Since the utilization of a single-ended signal and a differential signal are well known in this industrial field, people of ordinary skill in the art can appreciate the detail and the modification of the embodiment of FIG. 4 by referring to the embodiments of FIGS. 1~3; in other words, each feature of the embodiments of FIGS. 1~3 could be applied to the embodiment of FIG. 4 in a reasonable way and thus repeated and redundant description is omitted here.

Figure 5:
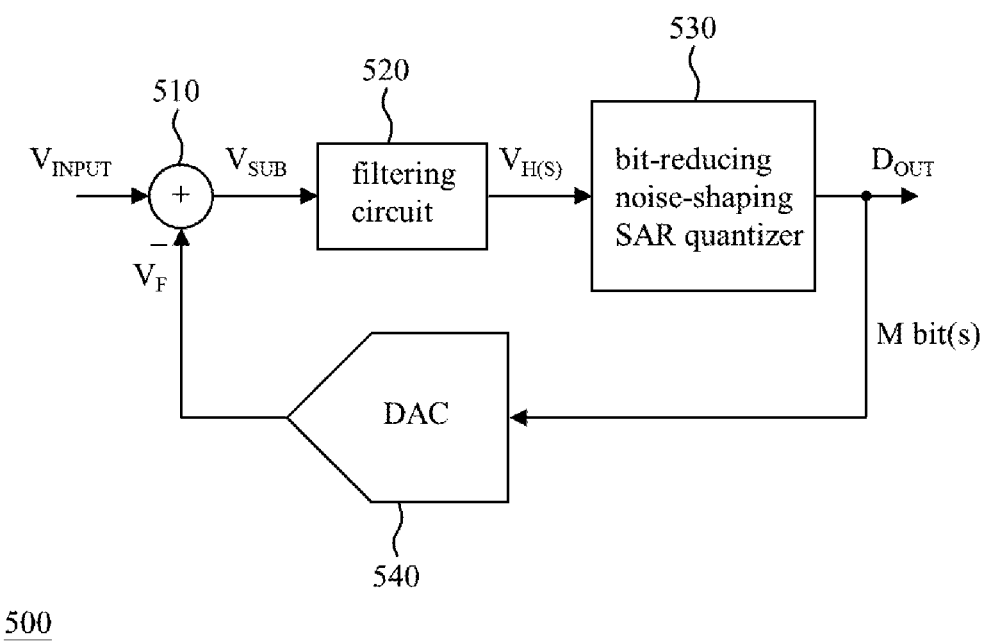
FIG. 5 shows an embodiment of the continuous-time sigma-delta modulator (CTSDM) of the present invention.

FIG. 5 shows an embodiment of the continuous-time sigma-delta modulator (CTSDM) of the present invention. The CTSDM 500 in FIG. 5 includes a calculating circuit 510, a filtering circuit 520, a bit-reducing noise-shaping SAR quantizer 530 and a digital-to-analog converter (DAC) 540. The calculating circuit 510 is configured to generate a to-be-filtered signal $V_{SUB}$ according to an input signal $V_{INPUT}$ and a feedback signal $V_F$; for instance, the calculating circuit 510 is a subtractor or the equivalent thereof which can subtract the feedback signal $V_F$ from the input signal $V_{INPUT}$ to generate the to-be-filtered signal $V_{SUB}$. The filtering circuit 520 is configured to generate a filtered signal $V_{H(S)}$ according to the to-be-filtered signal $V_{SUB}$; for instance, the filtering circuit 520 is an integrator or the equivalent thereof which can generate the filtered signal $V_{H(S)}$ in accordance with the to-be-filtered signal $V_{SUB}$. The bit-reducing noise-shaping SAR quantizer 530 is the aforementioned SAR quantizer 100 or the equivalent thereof, and is configured to generate a digital output signal $D_{OUT}$ according to the filtered signal $V_{H(S)}$, in which the bit-reducing noise-shaping SAR quantizer 530 is configured to generate M highly-significant bit(s) (i.e., M bit(s)) as the digital output signal $D_{OUT}$ according to the filtered signal $V_{H(S)}$ and generate L lowly-significant bit(s) according to the filtered signal $V_{H(S)}$ for executing noise-shaping operation based on the L lowly-significant bit(s); as a result, the problem of the excess loop delay caused by the L lowly-significant bit(s) is relieved. The DAC 540 is configured to generate the feedback signal $V_F$ according to the digital output signal $D_{OUT}$. Each of the above-mentioned calculating circuit 510, filtering circuit 520 and DAC 540 can be implemented with a known or self-developed circuit, and thus their detail is omitted here.

Figure 6:
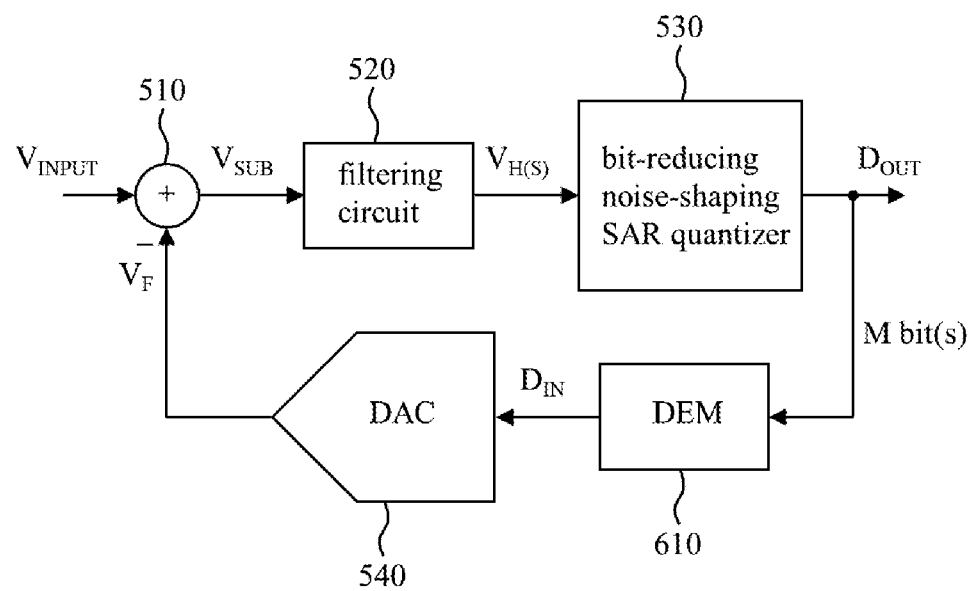
FIG. 6 shows another embodiment of the CTSDM of the present invention.

Providing the performance is acceptable, in order to prevent the circuit size of the DAC 540 from being too large, the CTSDM of the present invention can make use of a dynamic element matching (DEM) technique. FIG. 6 shows another embodiment of the CTSDM of the present invention. In comparison with the CTSDM 500 in FIG. 5, the CTSDM 600 in FIG. 6 further includes a DEM circuit 610 coupled between the SAR quantizer 530 and the DAC 540. In this embodiment, the DEM circuit 610 is configured to generate a digital input signal $D_{IN}$ according to the digital output signal $D_{OUT}$ (i.e., the M bit(s)) and the DAC 540 is configured to generate the feedback signal $V_F$ according to the digital input signal $D_{IN}$. The DEM circuit 610 can be implemented with a known or self-developed circuit, and thus the detail is omitted here.

Figure 7:
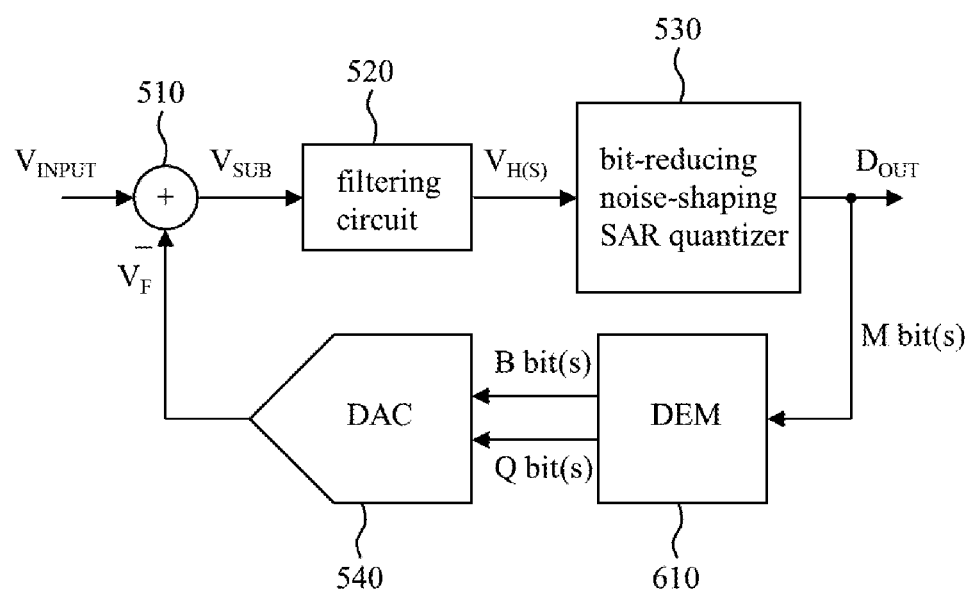
FIG. 7 shows an embodiment of the dynamic element matching circuit of FIG. 6.

In addition, if all bit(s) of the digital output signal $D_{OUT}$ is/are processed by the DEM circuit 610, the excess loop delay of the CTSDM 600 could be too long. In order to prevent this problem, as shown in FIG. 7, the DEM circuit 610 may be designed to merely process B highly-significant bit(s) (i.e., B bit(s)) of the digital output signal $D_{OUT}$ (i.e., the most significant bit and its following (B-1) bit(s) of the digital output signal $D_{OUT}$) and thereby output the processed signal as a part of the digital input signal $D_{IN}$ to the DAC 540; furthermore, the DEM circuit 610 directly outputs Q lowly-significant bit(s) (i.e., Q bit(s)) of the digital output signal $D_{OUT}$ (i.e., the least significant bit and its preceding (Q-1) bit(s) of the digital output signal $D_{OUT}$) to the DAC 540, in which the Q lowly-significant bit(s) is/are not processed by the DEM technique and is/are treated as the other part of the digital input signal $D_{IN}$, both the B and the Q are positive integers, and the sum of the B and the Q is the M. The technique of the DEM circuit 610 is named DAC MSB-only Randomization.

Since those of ordinary skill in the art can appreciate the details and the modifications of FIGS. 5~7 by referring to the embodiments of FIGS. 1~4, which means that each feature of the embodiments of FIGS. 1~4 could be applied to the embodiments of FIGS. 5~7 in a reasonable way, repeated and redundant description is omitted here.

It should be noted that a person of ordinary skill in the art can derive a practicable implementation from one or several embodiments of the present invention while this implementation can include some or all features of one embodiment of the present invention or include some or all features of several embodiments of the present invention, which means that the implementation of the present invention can be flexible.

To sum up, the bit-reducing noise-shaping SAR quantizer is configured to output a digital output signal according to one or more highly-significant-bit comparison result(s); therefore, the conversion delay of an SAR ADC using the bit-reducing noise-shaping SAR quantizer of the present invention merely includes a highly-significant-bit conversion delay without a lowly-significant-bit conversion delay. As a result, the bit-reducing noise-shaping SAR quantizer can achieve better performance. Moreover, the CTSDM of the present invention can not only use the bit-reducing noise-shaping SAR quantizer of the present invention to achieve better performance but also use the DAC MSB-only Randomization to reduce the demand for the circuit area of a DAC and lower the delay of a critical path caused by a DEM technique; consequently, the CTSDM of the present invention can achieve better performance and lower cost.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A successive approximation register (SAR) quantizer, comprising:
    an SAR highly-significant-bit switch circuit configured to successively generate M highly-significant-bit sampling result(s) according to an analog input signal and a first switch control signal, in which the M is a positive integer;
    a lowly-significant-bit switch circuit configured to successively generate L lowly-significant-bit sampling result(s) according to the analog input signal and a second control signal, in which the L is a positive integer;
    a comparing circuit configured to generate M highly-significant-bit comparison result(s) according to the M highly-significant-bit sampling result(s) and generate L lowly-significant-bit comparison result(s) according to the L lowly-significant-bit sampling result(s);
    a highly-significant-bit control circuit configured to generate the first switch control signal according to the M highly-significant-bit comparison result(s) and output a digital output signal according to the M highly-significant-bit comparison result(s); and
    a lowly-significant-bit control circuit configured to generate the second control signal according to previously-generated L lowly-significant-bit comparison result(s) and the L lowly-significant-bit comparison result(s);
    wherein each of the SAR highly-significant-bit switch circuit and the lowly-significant-bit switch circuit is electrically connected to the comparing circuit without passing through any capacitor.

2. The SAR quantizer of claim 1, wherein a number of bit(s) of the digital output signal is the M.

3. The SAR quantizer of claim 1, wherein a number of bit(s) of the digital output signal is greater than or equal to one.

4. The SAR quantizer of claim 1, wherein the SAR highly-significant-bit switch circuit includes:
    a first capacitor circuit configured to carry out sampling operation and charge-redistribution operation according to the analog input signal and a plurality of first reference voltages and thereby generate the M highly-significant-bit sampling result(s); and
    a first switch circuit configured to control connection between the first capacitor circuit and each of first reference voltage terminals according to the first switch control signal, in which the first reference voltage terminals are configured to provide the first reference voltages.

5. The SAR quantizer of claim 4, wherein the lowly-significant-bit switch circuit includes:
    a second capacitor circuit configured to carry out another sampling operation and another charge-redistribution operation according to the analog input signal and a plurality of second reference voltages and thereby generate the L lowly-significant-bit sampling result(s); and
    a second switch circuit configured to control connection between the second capacitor circuit and each of second reference voltage terminals according to the second control signal, in which the second reference voltage terminals are configured to provide the second reference voltages.

6. The SAR quantizer of claim 5, wherein in a current sampling and quantization cycle for the analog input signal, initial connection between the second capacitor circuit and each of the second reference voltage terminals is dependent upon the previously-generated L lowly-significant-bit comparison result(s) by the second control signal controlling the second switch circuit.

7. The SAR quantizer of claim 1, wherein the lowly-significant-bit switch circuit includes:
   a second capacitor circuit configured to carry out sampling operation and charge-redistribution operation according to the analog input signal and a plurality of reference voltages and thereby generate the L lowly-significant-bit sampling result(s); and
   a second switch circuit configured to control connection between the second capacitor circuit and each of reference voltage terminals according to the second control signal, in which the reference voltage terminals are configured to provide the reference voltages.

8. The SAR quantizer of claim 7, wherein in a current sampling and quantization cycle for the analog input signal, initial connection between the second capacitor circuit and each of the reference voltage terminals is dependent upon the previously-generated L lowly-significant-bit comparison result(s) by the second control signal controlling the second switch circuit.

9. A continuous-time sigma-delta modulator (CTSDM), comprising:
   a calculating circuit configured to generate a to-be-filtered signal according to an input signal and a feedback signal;
   a filtering circuit configured to generate a filtered signal according to the to-be-filtered signal;
   a bit-reducing noise-shaping successive approximation register (SAR) quantizer configured to generate a digital output signal according to the filtered signal, in which the bit-reducing noise-shaping SAR quantizer is configured to generate M highly-significant bit(s) as the digital output signal and generate L lowly-significant bit(s) so that the bit-reducing noise-shaping SAR quantizer is capable of carrying out noise-shaping operation according to the L lowly-significant bit(s), the M is a positive integer greater than one, and the L is a positive integer;
   a digital-to-analog converter (DAC) configured to generate the feedback signal according to the digital output signal; and
   a dynamic element matching (DEM) circuit coupled between the bit-reducing noise-shaping SAR quantizer and the DAC and configured to generate a digital input signal according to the digital output signal,
   wherein the DAC is configured to generate the feedback signal according to the digital input signal, the digital input signal includes B highly-significant bit(s) and Q lowly-significant bit(s), the DEM circuit is configured to process the B highly-significant bit(s) without processing the Q lowly-significant bit(s) for generating the digital input signal, and both the B and the Q are positive integers and a sum of the B and the Q is equal to the M.

10. The CTSDM of claim 9, wherein a number of bit(s) of the digital output signal is greater than or equal to one.

* * * * *